United States Patent [19]

Parry et al.

[11] 4,253,907
[45] Mar. 3, 1981

[54] ANISOTROPIC PLASMA ETCHING

[75] Inventors: Peter D. Parry, Montgomery; Leslie G. Jerde, Hopewell, both of N.J.

[73] Assignee: Western Electric Company, Inc., New York, N.Y.

[21] Appl. No.: 24,805

[22] Filed: Mar. 28, 1979

[51] Int. Cl.³ .................. H01L 21/306; B44C 1/22; C03C 15/00; C23F 1/02
[52] U.S. Cl. .................. 156/643; 156/646; 156/656; 156/657; 156/659.1; 204/192 E; 204/298; 250/531
[58] Field of Search .............. 156/643, 646, 653, 656, 156/657, 659.1, 662, 345; 252/79.1; 250/531; 204/164, 192 E, 192 EC, 298

[56] References Cited

U.S. PATENT DOCUMENTS

| 3,867,216 | 2/1975 | Jacob | 156/643 |
|---|---|---|---|
| 3,971,684 | 7/1976 | Muto et al. | 204/192 |
| 3,975,252 | 8/1976 | Haser et al. | 204/192 |
| 3,984,301 | 10/1976 | Matsuzaki et al. | 204/192 |
| 4,028,155 | 6/1977 | Jacob | 156/643 |
| 4,057,460 | 11/1977 | Saxena et al. | 156/643 |
| 4,064,030 | 12/1977 | Makai et al. | 204/192 E |
| 4,070,264 | 1/1978 | Loiseau et al. | 204/192 E |
| 4,073,669 | 2/1978 | Heinecke et al. | 156/643 |
| 4,134,817 | 1/1979 | Bourdon | 204/192 E |
| 4,208,241 | 1/1980 | Harshbarger | 156/657 X |

OTHER PUBLICATIONS

IBM Technical Disclosure Bulletin, vol. 20, No. 5, Oct. 1977, Isotropic and Anisotropic Etching in Adiode System by Gartner et al., pp. 1744–1745.

Primary Examiner—William A. Powell
Attorney, Agent, or Firm—B. W. Sheffield

[57] ABSTRACT

Method of anisotropically etching a semiconductor substrate (32). The substrate (32) is placed in an evacuated reaction chamber (50) and exposed to a gas plasma (63) which has been excited with an AC source having a frequency greater than 0 Hz but less than 300 KHz. The pressure in the chamber, and chamber geometry, are such that the volume power density of the plasma is less than 0.01 W/cm³.

32 Claims, 13 Drawing Figures

VOLUME LOADED REACTOR

SURFACE LOADED REACTOR

ANISOTROPIC PLASMA ETCHING

TECHNICAL FIELD

Broadly speaking, this invention relates to etching. More particularly, in a preferred embodiment, this invention relates to methods and apparatus for anisotropically etching a workpiece with a gas plasma which has been excited by a low-power, low-frequency AC excitation source.

BACKGROUND OF THE INVENTION

The manufacture of semiconductors and integrated circuits necessarily involves selective modification of the electrical and physical properties of the substrate from which the devices are to be made. This selective modification is typically accomplished by exposing the substrate to some suitable modifying agent through the windows of an apertured process mask. For example, in the case of silicon, the process mask might comprise a thin, patterned layer of silicon dioxide which has been overlayed on a silicon substrate and the modifying agent might comprise a beam of ions, for example boron.

Advantageously, the process mask is formed in situ, for example, by overlaying the masking material with a layer of some suitable photoresist which is then exposed to the image of the desired mask pattern, using either contact or projection printing. Alternatively, a non-photosensitive resist may be used which is then patterned by electron beam or X-ray lithography. In either event, after exposure, the resist is developed and the exposed portions chemically removed to yield the desired masking pattern.

The next step in the process is generally to remove the underlying masking material, e.g., by a wet chemical etch, through the apertures in the photomask, thereby to form the process mask which is needed for subsequent modification of the underlying silicon substrate.

As is well known, in recent years, there has been an ever-increasing trend towards large scale integration (LSI) and the manufacture of such diverse devices as 16-bit microprocessors, 64K memory chips, etc. Because of the component density in such devices, the line widths which are required to fabricate and to interconnect the active devices on each LSI chip approach $\mu m$ and sub-$\mu m$ dimensions.

As a result of these requirements, the use of wet chemical etching to transfer the resist pattern to the underlying device material has become undesirable. The reason for this is that wet chemical etching is an isotropic process; that is, the etch rate is the same in all directions. This means that the etchant tends to undercut the resist at the resist-semiconductor interfaces. The practical effect of this undercutting is that the line widths formed in the process mask are substantially wider than those which were contained in the overlaying resist mask.

To a certain extent, this effect can be compensated for by making the line widths on the photomask substantially narrower than is actually desired for the corresponding line widths on the process mask. This assumes, of course, that the undercutting that occurs during the chemical etch will widen these lines to their desired width. However, since the degree of undercutting that occurs in a given process is difficult to control, this is not an entirely satisfactory solution to the problem. Furthermore, if the line widths on the process mask are such as to push the limits of technology, then obviously to lay down even narrower line widths on the photomask becomes an exceedingly difficult task. This difficulty is compounded by the fact that physical phenomena, such as the wave-length of the light used to transfer the image, may also become significant and limiting factors.

SUMMARY OF THE INVENTION

As a solution to these and other problems, the instant invention manipulates the physics of the etch process itself to convert the process from an isotropic process to an anisotropic process. More specifically, in a preferred embodiment, the instant invention comprises a method of anisotropically etching a workpiece which is positioned within an evacuated reaction chamber. The method comprises the steps of first creating a partial vacuum in the reaction chamber so that the pressure in the chamber is less than one torr and then, flowing a stream comprising at least one etchant gas through the chamber. The stream of gas is excited by applying an alternating electric field to form a plasma. The alternating electric field used to excite the gas has a frequency which is greater than 0 Hz but less than 300 KHz. The workpiece is next exposed to the plasma for a predetermined time interval to etch the workpiece.

The invention and its mode of operation will be more fully understood from the following detailed description, when taken with the appended drawings, in which:

DETAILED DESCRIPTION

Figure 1:
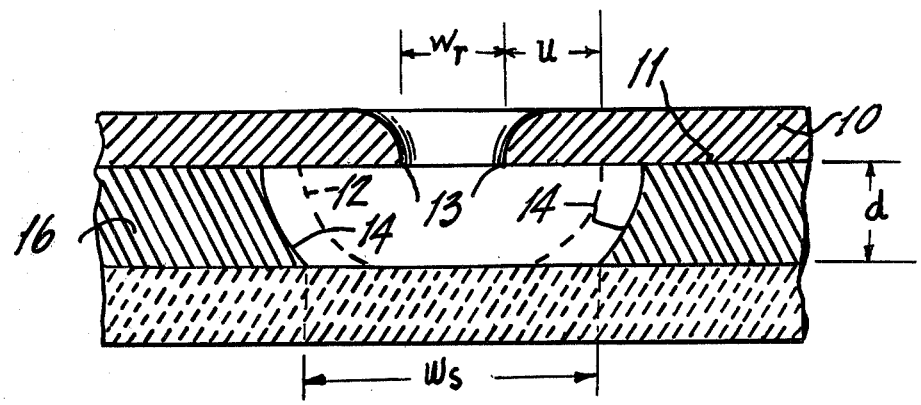
FIG. 1 is a partial cross-sectional view of an illustrative workpiece which has been etched with a prior art, wet chemical process.

As previously mentioned, the use of wet chemical etching to transfer a resist pattern to underlying masking material is becoming less and less attractive. The reason for this is that wet chemical etching is isotropic; that is to say, the etch rate is the same in all directions. As shown in FIG. 1, which represents a typical etching situation, a wet chemical etchant will undercut the resist 10 at the resist-semiconductor interface 11 by an amount u which, in general, will be equal to the depth of etch d. In the absence of resist erosion, the etch profile 12 which results, is a quarter arc of a circle of radius d, centered at the point 13 where the resist edge intersects the original surface. If, as is typically the case, the wafer is overetched to assure complete removal of layer 16, or if the resist is also attacked by the etchant, the profile that results will be the sloped line 14 and the undercut will be greater than the etch depth.

If the anisotropy, A, of the above etching system is defined as:

$$A = d/u \quad (1)$$

then for wet chemical etching, with no resist attack and good adhesion at the resist substrate interface, it has been found that $A=1$. If the adhesion between resist 10 and the masked material 16 is poor, or if the resist is attacked by the etchant, it has been found that $A<1$.

Assuming the best case, with $A=1$, FIG. 1 shows that in order to produce a line of width $w_s$ in the etched material 16, the resist pattern must be compensated; that is, made smaller by an amount equal to twice the undercut. If $w_r$ is the width of the line in the resist pattern, then $w_r$ and $w_s$ are related by the expression:

$$w_r = w_s - 2u \quad (2)$$

Now, for an anisotropic etchant, it will be evident that, $u<d$, or to put it another way, that $A>1$. Thus, if the anisotropy of the etchant could be increased, the resist pattern would need less compensation.

Figure 2:
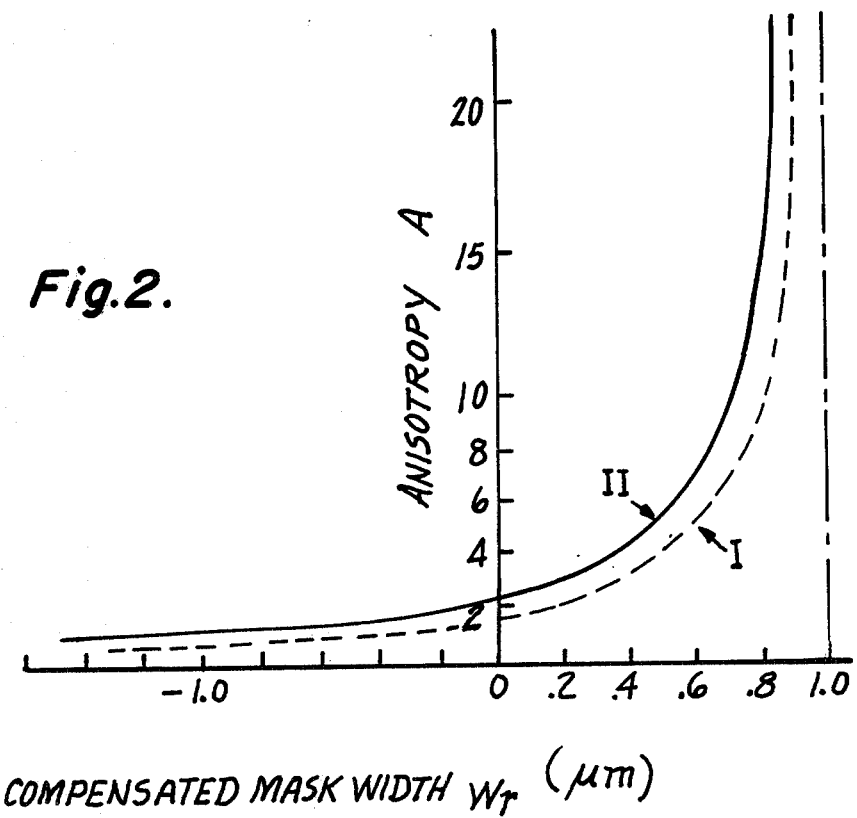
FIG. 2 is a graph showing the manner in which a process mask must be compensated to correct for the undercutting that typically occurs with known, prior art wet chemical etches, as a function of the degree of anisotropy in the etching process.

FIG. 2 shows the relationship between the anisotropy A and the width of the resist pattern $w_r$ which is required to produce a 1 μm wide pattern $w_s$ in a substrate layer 1 μm thick. Curve I in FIG. 2 represents the situation shown by dashed line 12 in FIG. 1, i.e., the situation wherein the etching process is terminated at the exact point when the interface between layer 16 and substrate 17 is exposed. Curve II, on the other hand, corresponds to a 30% overetch, i.e., the situation illustrated by solid line 14 in FIG. 1. This degree of overetch is typically required in production to guarantee that all the windows on a wafer will be fully cleared because both the etching action and the thickness d of the layers to be etched are, in general, non-uniform. For this illustrative example, curve II shows that for $A=1$ (isotropic etching), it is simply not possible to produce a 1 μm wide pattern, i.e., $w_r<0$. For a moderately anisotropic etch, $A=3$ say, the resist would have to be compensated to a width of 0.2 μm—a very difficult task. However, if A were 10, say, then a 1 μm line could be transferred to the substrate from a 0.74 μm resist pattern, which is well within the capabilities of existing X-ray or electron beam technology.

From the preceding example, it will be appreciated that some degree of etching anisotropy is essential if integrated circuits are to be produced with the fine line widths required for modern LSI. At any given point in time, LSI circuit density can be increased by either improving existing lithographic capabilities, i.e. decreasing $w_r$, or by the use of better anisotropic etching techniques, i.e. decreasing u. The invention disclosed and claimed herein is concerned with the latter approach.

As is well known, ion beam milling and sputter etching were the first successful anisotropic pattern transfer techniques, which is fortunate as they are the most easily understood. In either of these two cases, energetic atoms of a non-reactive gas, produced by an ion beam or an RF or DC plasma respectively, are directed towards the substrate to remove material by physical sputtering. Because the incoming beam has a relatively large momentum component perpendicular to the surface of the substrate, sputtering proceeds more rapidly downward than sideways, thus producing an anisotropic profile ($u<d$). Because of its excellent anisotropy, ion milling has been applied commercially to the fabrication of fine linewidth magnetic bubble memory devices, and the like. Unfortunately, ion milling and conventional sputter etching suffer from several disadvantages including a low etch rate, poor selectively, faceting, and redeposition, all of which render them less than attractive for universal application.

In contrast to RF and DC sputtering, plasma etching is a term that may be applied to any of several techniques wherein the species which arrive at the surface of the semiconductor wafer are chemically reactive with it. Ideally, the reaction products are volatile and are pumped away with the unreacted gases by the vacuum system, which typically maintains a low pressure, in the order of 0.01 to 10 torr, in the etching reactor. Typically, the etching species are created in a plasma discharge region and either diffuse to, or are directed towards, the wafer surface. To the extent that the reaction products are volatile, redeposition effects are reduced. Further, because the energy of the particles is sufficiently low that sputtering is not substantial, faceting is not observed. By judicious choice of the etching species, plasma etching can be made more selective, with etch rates which are much higher than those obtained with ion milling or with RF or DC sputter etching.

Figure 3:
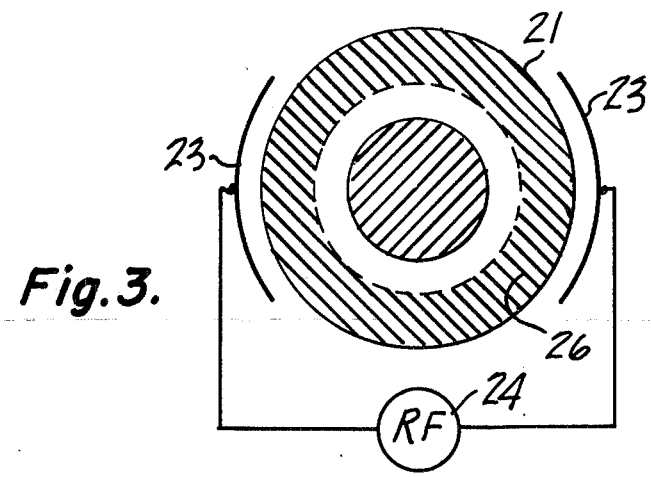
FIG. 3 is a cross-sectional view of an illustrative, prior art, volume-loaded reactor for the plasma etching of workpieces.
Figure 4:
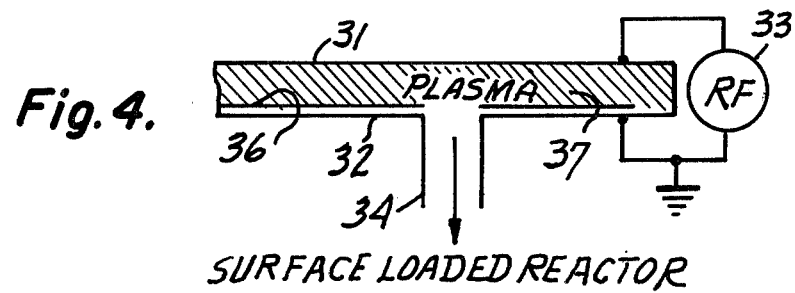
FIG. 4 is a cross-sectional view of an illustrative, prior art, surface-loaded reactor for the plasma etching of workpieces.

As is well known, there are two generic configurations of commercially available plasma etching systems; these are commonly referred to as volume loaded systems and surface-loaded systems and are illustrated in FIGS. 3 and 4, respectively. As shown in FIG. 3, a typical, prior art, volume loaded reactor comprises a hollow quartz reactor tube 21 having a plurality of silicon wafers 22 coaxially positioned therein. A pair of arcuate electrodes 23, connected to and excited by an RF source 24, create a plasma 26 within tube 21 for the etching of the silicon wafers. By way of contrast, the typical, prior art, surface-loaded reactor shown in FIG. 4 comprises an upper electrode 31 and a lower electrode 32, both of which are connected to, and excited by, an RF source 33. The lower electrode is typically grounded and includes an opening 34 through which the spent gas is exhausted. The semiconductor wafers 36 are placed on the lower electrode 32 and etched by plasma 37 which is created by the energy from the RF source 33.

A series of experiments conducted by the applicants herein demonstrated that in ordinary operation, volume loaded reactors tended to produce highly undesirable isotropic etch profiles. These experiments were conducted with single-crystal silicon wafers masked with KTFR photoresist etched to a depth of 2 $\mu$m. The etching was performed with an RF plasma formed from a 92% $CF_4$–8% $O_2$ gaseous mixture at a pressure of 600 millitorr using an RF power of 3 Watts at a frequency of 13.56 MHz. A series of scanning electron micrographs taken of the single-crystal silicon wafers, before and after etching, revealed that photoresist lines of a nominal width of 4 $\mu$m were etched sufficiently to reduce the silicon under the resist pattern to a mere cusp. These micrographs clearly illustrated that the profile of the etch material was isotropic, as previously suggested. Photoresist lines of a nominal 3 $\mu$m width were also examined and it was found that the silicon had been eroded entirely from under the mask and that the resist pattern had tipped over on its side. Resist lines of a nominal width of 1.5 $\mu$m, etched for the same time period, disappeared completely; the only vestige of the original pattern being the resist residue and an undulation or roughening of the silicon surface where the photoresist pattern used to exist.

This type of etch profile can be explained as follows: in the $CF_4$–$O_2$ plasma, under the stated etching conditions, it is believed that the etching species is atomic fluorine, F. The fluorine radical F° is produced in the plasma and diffuses to the surface of the silicon where etching occurs, forming volatile $SiF_4$ which, in turn, diffuses away from the surface. Oxygen appears to play an important role in this process, both in the production of F° and in the surface reaction. Importantly, there is no evidence of directionality in either the arrival of the etchant species or in the removal of the reaction products; therefore, the etch profile should be isotropic, as was confirmed by our experiments. Turning to FIG. 4, it has been found that plasma etching in surface-loaded reactors also often produces isotropic etch profiles. However, under some circumstances, anisotropic etch profiles have been observed. The results noted fall into two pressure regions: traditional plasma etching, conducted at vacuum levels ranging from 100 millitorr, to 10 torr, and reactive ion etching or reactive sputter etching conducted at vacuum levels which are below 100 millitorr. The processes in the 100 millitorr to 10 torr region are generally believed to be chemical in nature, similar to those above-described with reference to the volume-loaded reactor of FIG. 3. However, in the lower pressure region, material is removed by collisional energy transfer enhanced by the fact that the projectile atoms or ions are reactive rather than inert.

At this point, it would perhaps be instructive to review the examples of anisotropic etching which have been reported in the literature for each of the above pressure regions. The first such report disclosed the anisotropic etching of $SiO_2$ in a surface-loaded reactor. The operating parameters for this reactor were a pressure of 300 millitorr, an electrode gap of approximately 1 cm, and an RF power greater than 1,000 Watts at an RF frequency of 1 MHz. The etchant gases employed were $CHF_3$ and $C_3F_8$. No quantative explanation for the anisotropic etch profiles which were observed in the above experiments is available, although it has been suggested that ionic species were involved. Other experiments achieved anisotropic etch profiles for $SiO_2$, $Si_3N_4$, Si, poly Si, and Al, under plasma etching conditions. Other workers have also reported anisotropic plasma etch profiles for aluminum. Although the present invention is primarily concerned with the anisotropic etching of semiconductor materials, such as silicon, it is believed that the technique should also apply to other materials, such as aluminum or tantalum. It should be noted that anisotropic profiles for metals, such as tantalum or aluminum, generally require very high power densities, in the order of 0.5 to 1 $W/cm^2$ at pressures above 100 millitorr, which would be destructive to conventional photoresist and electron or X-ray resist masking material.

Figure 5:
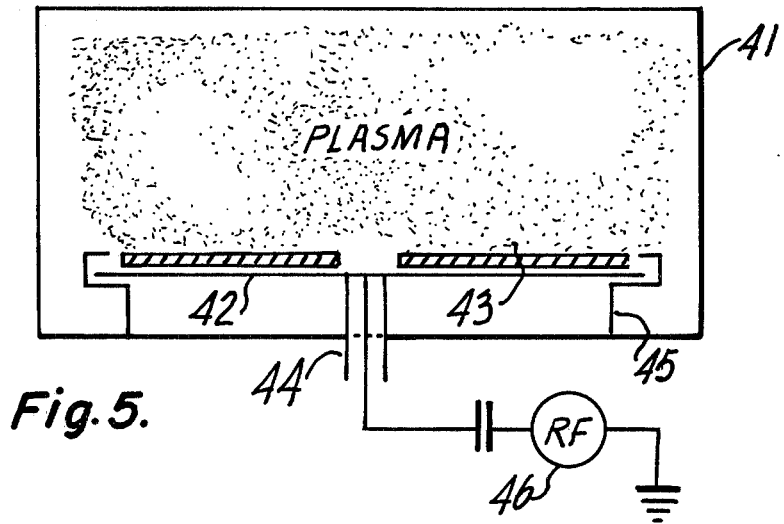
FIG. 5 is a cross-sectional view of an illustrative, prior art reaction chamber etching apparatus.

Turning now to reactive ion etching, at pressures below 100 millitorr there are many reports of anisotropic etching and a mechanism to explain this has been proposed. As shown in FIG. 5, a typical reactive ion etching apparatus comprises a sealed cylindrical chamber 41 which includes a cylindrical electrode 42 upon which the wafers 43 to be etched are placed. Electrode 42 is supported above the floor of chamber 41 by a stepped cylindrical ground shield 45. An opening 44 is connected to the center of electrode 42 to exhaust spent gases from the chamber. An inlet (not shown) supplies the reactive gases to perform the etching.

A plasma is created inside chamber 41 by means of an RF source 46 which is connected to electrode 42 and, via common ground, to the walls of chamber 41. It will, of course, be observed that the two electrodes, i.e., electrode 42 and the walls of chamber 41, are unequal in area. When a plasma is struck in the region immediately above the wafers, RF electrode 42, which is capacitively coupled to supply 46, floats to a negative DC bias with respect to the plasma potential. As a result of this bias, reactive ionic species are extracted from the plasma. These ions anisotropically etch the substrates because they follow electric field lines which are normal to the surface of the wafers. However, near the edges of the RF electrode, the ion trajectionaries curve, due to fringing fields, which results in corresponding, undesirable distortions in the etch profile.

Let us now consider a comparison of the characteristics of plasma etching processes conducted at pressures greater than 100 millitorr with reactive ion etching processes conducted at pressures less than 100 millitorr for substrates comprised of $SiO_2$, $Si_3N_4$, Si and poly Si.

TABLE I

COMPARISON OF HIGH PRESSURE AND LOW PRESSURE ETCHING

| | PLASMA ETCHING (p > 100 mtorr) | |
|---|---|---|
| | HIGH POWER | LOW POWER |
| ANISOTROPY | NOTE 1 | NO |
| $R_s > 500$Å/min | YES | YES |
| $R_s/R_{PR} > 5$ | NO | YES |
| $V_{rf} < 1$ keV | NO | YES |
| T > 25 wafers/hr | YES | YES |

| | REACTIVE ION ETCHING (p < 100 mtorr) | |
|---|---|---|
| | HIGH POWER | LOW POWER |
| ANISOTROPY | YES | ? |
| $R_s > 500$Å/min | NO | NO |
| $R_s/R_{PR} > 5$ | NO | YES |
| $V_{rf} < 1$ keV | NO | YES |

TABLE I-continued

| T > 25 wafers/hr | NO | NO |
|---|---|---|

NOTE 1
MIXED RESULTS; DEPENDS SENSITIVELY ON ETCH PARAMETERS.

Table I, above, compares the etching results obtained for the two pressure regions described. To simplify the discussion, a pressure of 100 millitorr was chosen as the dividing line, although it should be understood that the operating parameters and etching results generally change smoothly with pressure and the values listed are typical of the mid-point of each pressure region; thus, the 100 millitorr dividing line is somewhat arbitrary. The characteristics of the etching processes are further subdivided into categories of high and low power density, typically 1.0 W/cm² and 0.1 W/cm². The etching results tabulated are: anisotropy A, as defined previously in equation 1; the etch rate of the material to be etched, $R_s$; and the resistance of the resist to etching, expressed as the ratio of $R_s$ to the resist etch rate $R_{PR}$. The operating characteristics shown in Table I are: the peak-to-peak RF voltage applied across the electrodes, $V_{rf}$; and the machine throughput, T defined as the number of 3-inch wafers which can be etched in an hour to a depth of 5000 Å, a typical thickness for the polysilicon, $SiO_2$, and $Si_3N_4$ layers etched in production applications. For a given material, the etch results will obviously also depend on parameters such as the etch gas, pressure, power, flow rate, and wafer temperature. However, since such information has been extensively reported in the literature, it is not reported here or shown in Table I. The intention of Table I is to point out general trends rather than to give specific details.

The first trend which is apparent from Table I is that reactive ion etching usually produces anisotropic etch profiles at high power density, with mixed results at low power density. Plasma etching, on the other hand, at low power density gives consistently isotropic profiles. At high power density isotropic profiles are also common, but nevertheless there are several reports in the literature of anisotropic etching of $SiO_2$, phosphorus doped $SiO_2$, $Si_3N_4$ and poly Si.

The second trend which is evident from Table I is that etch rates tend to be much higher at high pressure than at low pressure. Plasma etching rates are usually above 500 Å per minute, whereas high power density, reactive ion etching rates barely reach this value.

Resist attack appears to be more related to power density than to pressure and sets the upper limit on usable power density in both etching systems. It has been reported in the literature that resist attack can be reduced by cooling the electrode which holds the wafers, but the exact mechanism by which the resist etches, or decomposes, has not yet been fully explained.

Another distinction between the two etching systems is that the peak-to-peak RF voltage across the electrodes is lower for plasma etching than for reactive ion etching. However, $V_{rf}$ depends more strongly on power than on pressure and at high power density both types of systems are typically operated with $V_{rf} > 1$ KeV. $V_{rf}$ is an important parameter becase it is equal to twice the energy of the most energetic electrons striking the wafers. Because these high energy electrons have been implicated in MOS radiation damage, it is obviously desirable to decrease their energy and flux. However, because the radiation damage produced by plasma etching at high power densities can be successfully annealed, a high value for $V_{rf}$ should not necessarily rule out an otherwise successful plasma etching or reactive ion etching system.

The wafer throughput T depends on the etch rate $R_s$ and the size of the batch which can be loaded into the reactor. On both counts, a reactive ion etching system is at a disadvantage when compared to a plasma etching system of similar dimensions. The reactive ion etching rate is lower, often by more than a factor of 10. Also, the batch size is smaller because the RF electrode on which the wafers are supported must be appreciably smaller than the effective ground electrode, in order that the necessary self-bias can be developed.

A successful plasma etching program should produce the following results: (1) anisotropic etch profiles in the workpieces etched; (2) minimal mask attack using conventional photoresists, electron resists and X-ray resists; (3) a machine throughput which is consistent with production line wafer volumes; and (4) no unannealable MOS contamination or radiation damage.

As previously discussed, neither reactive ion etching nor plasma etching, as they have heretofore been practiced, satisfy all these requirements. In the instant invention, the plasma parameters are shifted in such a manner as to combine the advantages of both reactive ion etching and plasma etching.

Figure 6:
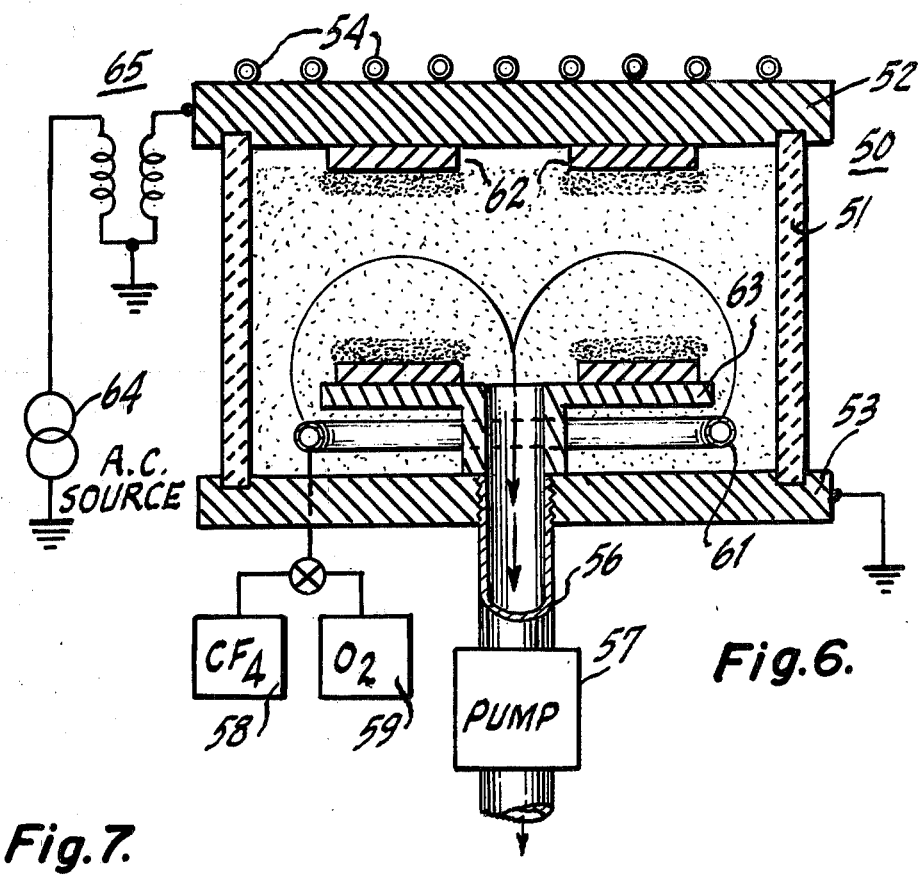
FIG. 6 is a cross-sectional view of an illustrative reaction chamber according to the invention.

An illustrative etching reactor according to the instant invention is shown in FIG. 6, although it should be emphasized that other configurations are possible. As shown, reactor 50 comprises a sealed reaction chamber defined by upper and lower cylindrical electrodes 52 and 53, respectively, and a hollow, cylindrical member 51 of a non-conductive material such as quartz. The upper electrode 52 is cooled by means of a plurality of pipes 54 through which a coolant, such as water, is flowed. The wafer pedestal (lower electrode) may also be cooled, if desired. The lower electrode contains an aperture 56 through which spent gases may be exhausted by means of a pump 57. Etchant gas, for example, a mixture of $CF_4$ and $O_2$ is supplied from reservoirs 58 and 59 to a circular supply pipe 61 positioned near the lower electrode 53. Workpieces 62 to be etched are supported both on the upper electrode 52 and on a conducting circular metallic support pedestal 63 which is secured at its lower end to the electrode 53. The pedestal 63 is also cooled. An alternating electric field is established between electrodes 52 and 53 by an AC source 64 which is connected to the primary of a transformer 65, the secondary of which is connected to electrode 52. Electrode 53 is directly grounded and electrode 52 is grounded through the secondary winding of transformer 65. This arrangement insures that no DC potential can build up on either of the two electrodes; however, this arrangement in no way interferes with the application of the AC potential across the electrodes.

An experimental prototype of the reactor shown in FIG. 6 was actually built and tested. This experimental reactor could hold up to 12 3-inch wafers on each electrode, thus the total capacity of the system was 24 3-inch wafers.

Figure 7:
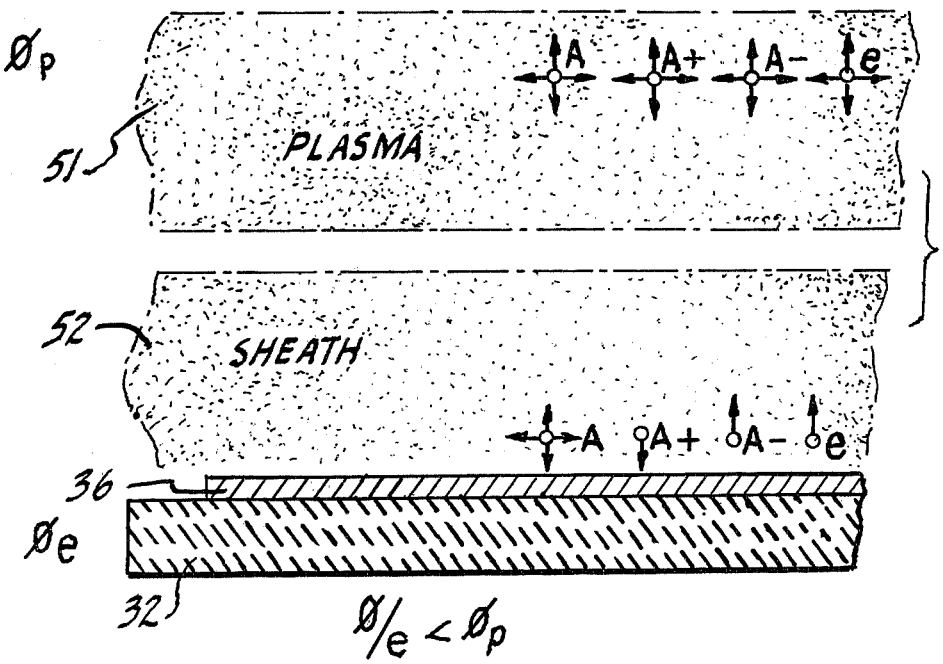
FIG. 7 is a partial cross-sectional view illustrating the physical phenomena which occur in the region of a substrate as it is plasma etched in the reaction chamber of FIG. 6.

The reaction region near one of the electrodes in the reaction chamber of FIG. 6 is shown schematically in FIG. 7. The gaseous plasma 51 that forms above the wafers comprises a nearly neutral collection of electrons, positive and negative ions, and neutral species. In plasma 51, the velocity distribution of all the species is isotropic, as illustrated in FIG. 7. A plasma sheath 52 typically forms to screen the plasma (at potential $\phi_p$) from the electrode potential $\phi_e$. When $\phi_e$ is less than $\phi_p$, i.e., during part of the AC cycle, positive ions are accelerated across the sheath and strike the electrode at normal incidence, provided ion-neutral collisions can be minimized. On the other hand, electrons and negative ions will bombard the electrode if it becomes positively biased with respect to the plasma potential during another part of the AC cycle. The arrival of charged species at the wafer surface is further influenced by self-biasing voltages which build up on the resist and on the dielectric surfaces being etched, e.g., $Si_3N_4$ and $SiO_2$. These voltages $\phi_w$ are time dependent and are, in part, a function of the RF impedance between the dielectric material and the electrode. During the entire RF cycle, neutral species from the plasma also bombard the surface. These neutral species may be isotropic, or they may have enhanced momentum which is normal to the surface due to collisions with ions. The initial experiments which we conducted to increase the directed particle flux, i.e., the number and density of charged and neutral particles having an excess momentum perpendicular to the wafer surface, were based on the observations which we made during our previous experiments on the plasma deposition of silicon nitride on silicon. In these prior experiments, it was found that the stress in the deposited film was a sensitive function of the RF excitation frequency. The change in stress was tentatively attributed to the role of ion bombardment as it affected the morphology of the film growth. Such effects have also been seen in RF ion plating. Therefore, the first experiments in our attempt to develop a new plasma etching program were performed at low frequencies. Most of our experiments were conducted on polysilicon and single-crystal silicon substrates masked by AZ1350B photoresist. The etch gas employed comprised 85% $CF_4$ and 15% $O_2$. This particular gas, which normally etches isotropically, was purposely chosen to make certain that any effects we observed were related to the operating parameters of the system, e.g., the frequency and pressure, and not to the particular etch gas used. All experiments were conducted with a power density of less than 0.04 W/cm$^2$, with electrodes of 20 cm. radius. The pressure, as measured by commercial capacitance manometer, was varied from 530 millitorr to below 35 millitorr. Etching runs were performed at excitation frequencies of 300, 50 and 8 KHz.

Figure 8:
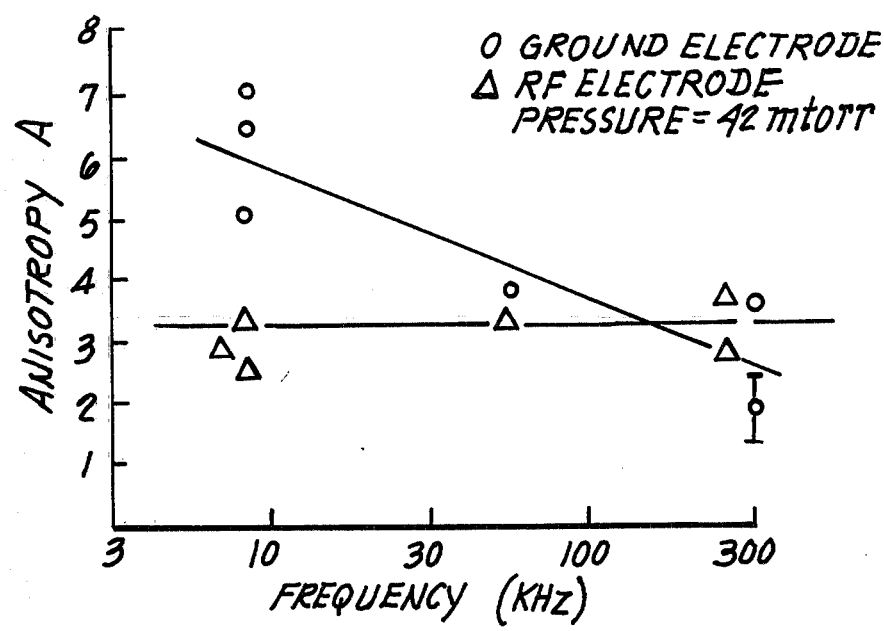
FIG. 8 is a graph showing the dependence of the etching anisotropy on the plasma excitation frequency.
Figure 9:
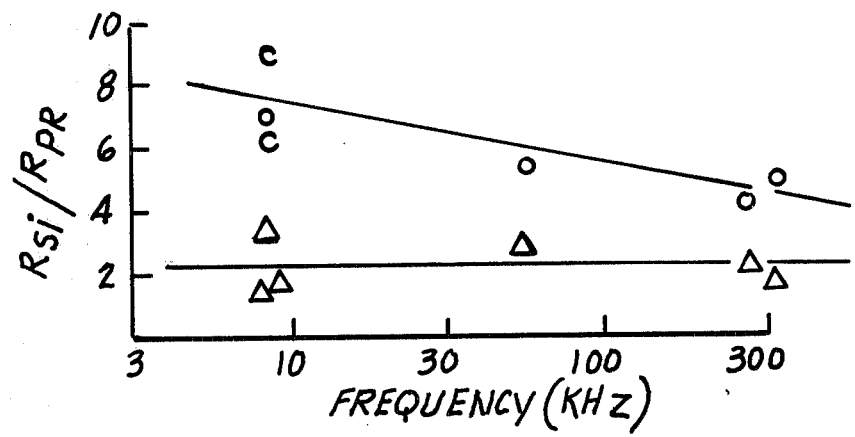
FIG. 9 is a graph showing the ratio of silicon etch rate to the photoresist etch rate in a typical workpiece, as a function of the plasma excitation frequency.

FIGS. 8 and 9 respectively show the results of our experiments, that is the anisotropy A, and the ratio of the silicon etch rate $R_{Si}$ to the photoresist etch rate $R_{PR}$, as a function of frequency. Both graphs depict data which are collected at a pressure of 42 millitorr. On the graphs, the points shown by circles refer to the ground electrode while the points depicted by triangles refer to the RF electrode. The error bars on the anisotropy points indicate the uncertainty in measuring A, as defined in equation 1, from scanning electron micrographs. When A is small, the uncertainty in measuring the etch depth d and the undercut u contribute equally. When A is large, the percentage of uncertainty in u predominates because u is so small. For example, when A=10, u=500 Å for a 5000 Å thick film and it is difficult to measure u to better than +100 Å. Although there is some scatter in the anisotropy data shown in FIGS. 8 and 9, several definite trends can be noted. First, for all the frequencies studied, the etch profiles are definitely anisotropic. Also the largest anisotropies are obtained at the lowest frequency. Except for the data taken at 300 KHz, physical examination, e.g., scanning electron micrographs of cross sections of the samples, shows that the samples which were etched on the RF electrode exhibit greater undercutting than those on the ground electrodes. The ratio $R_{Si}/R_{PR}$ is acceptably large, i.e., greater than 5, for all samples etched on the ground electrode. For the RF electrode, $R_{Si}/R_{PR}$ varies between 1 and 3. This is believed to explain the reason why dimensional control is not so good on the samples which were etched on the RF electrode than those etched on the ground electrode. This effect may also be due to the fact that in the experimental model, the RF electrode was not cooled. It will be evident from the above results that the goal of equivalent etching action on both electrodes was not fully achieved in the experimental set-up. However, when each electrode is taken individually, the anisotropy is large enough to be useful.

Figure 10:
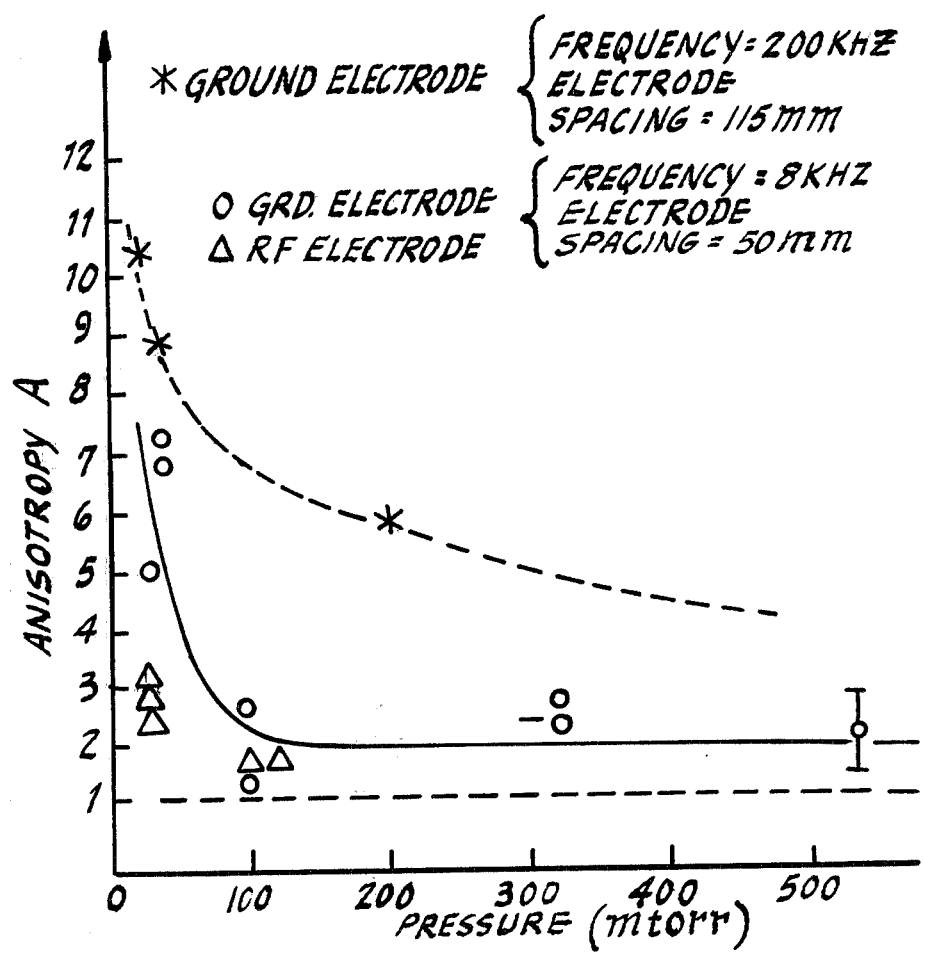
FIG. 10 is a graph showing the manner in which the etching anisotropy varies, as a function of the pressure in the reaction chamber.

As the pressure in the reaction chamber is increased, going, for example, from a reactive ion etch to a plasma etch regime, the anisotropy changes dramatically. As shown in FIG. 10, the anisotropy A drops sharply from an average value of 6 on the ground electrode at 42 millitorr to an an average value of 2 at a pressure of 100 millitorr. For higher pressures, the anisotropy remains at 2, which is not generally high enough to be commercially useful but which is nevertheless significantly above the value of 1 obtained at the more conventional excitation frequency of 13.56 MHz. The strong dependence of A on pressure, for pressures between 42 and 100 millitorr, yields a clue as to the reason for the large scatter in the data shown in FIGS. 8, 9 and 10. When an etching run at a pressure of 42 millitorr begins, the pressure apparently rises abruptly to about 60 millitorr and then decays back to 42 millitorr, with a time constant of about 15 minutes. Since the etching runs plotted in FIGS. 8, 9 and 10 were for periods of 10 to 15 minutes, this observed pressure fluctuation represents a significant perturbation on the run conditions. The mechanism underlying the pressure fluctuation is not fully understood. The significance of this pressure variation is not that it makes the pressure readings "inaccurate", but rather that it is a harbinger of changes in the plasma potential $\phi_p$, the ion-neutral scattering length, and the concentrations of species in the plasma.

Figure 11:
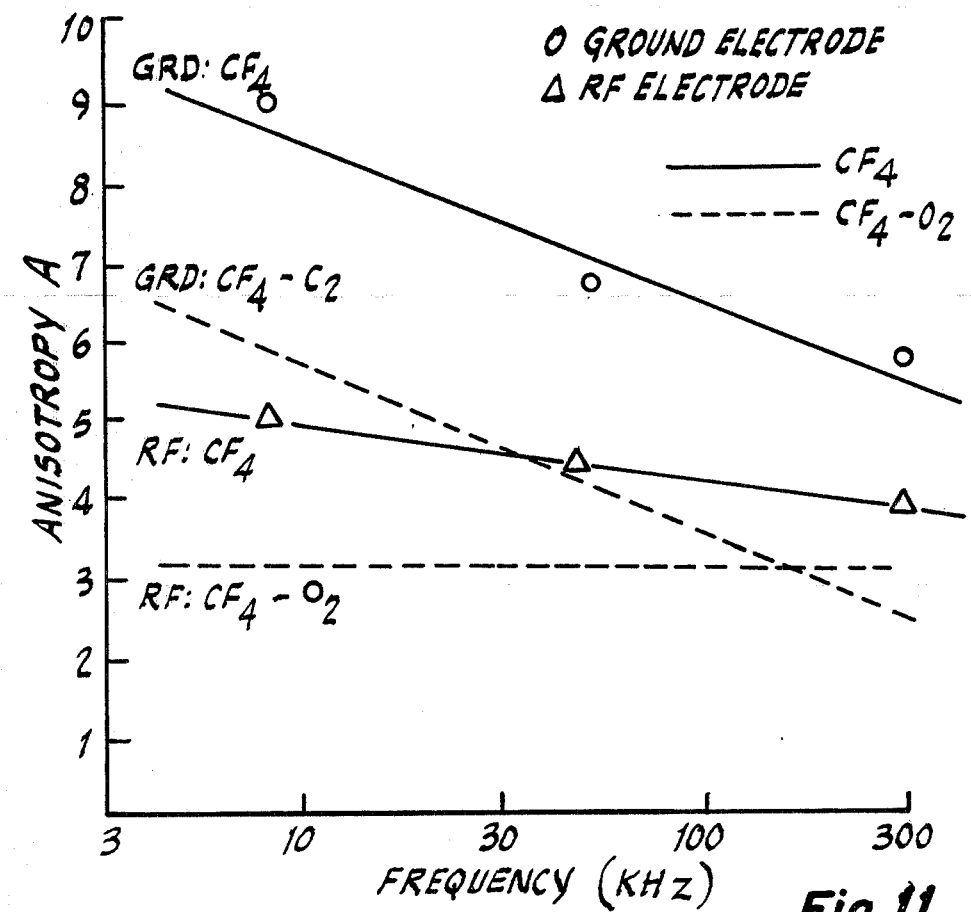
FIG. 11 is a graph showing, for both the ground electrode of the reaction chamber shown in FIG. 6 and the RF electrode of the reaction chamber shown in FIG. 6, the etching anisotropy, as a function of the excitation frequency, for both $CF_4$ and $CF_4\text{-}O_2$ plasmas.
Figure 12:
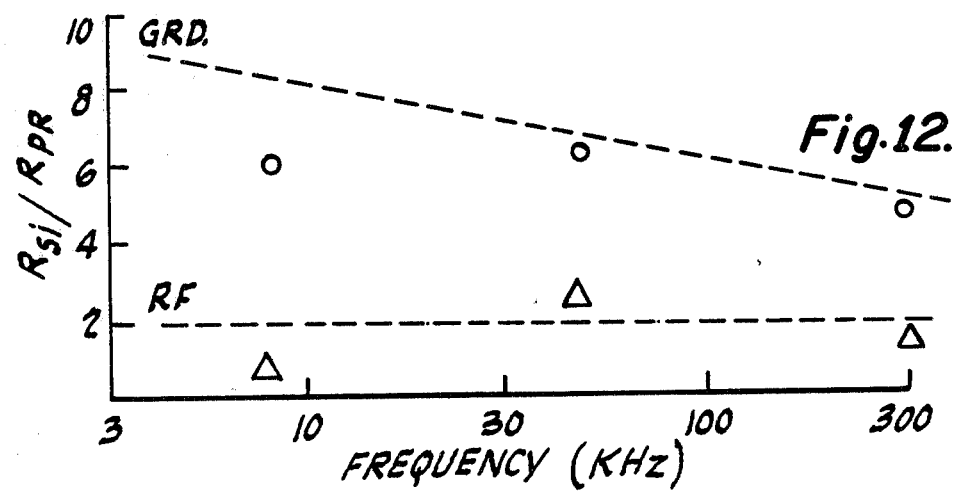
FIG. 12 is a graph showing the ratio of silicon etching to photoresist etching for a typical workpiece, as a function of the excitation frequency, for both the ground and the RF electrodes.

When etching with a $CF_4$-$O_2$ mixture, there is always a large flux of neutral F° radicals available for isotropic etching. The ionic species must compete with these radicals to produce an anisotropic profile. Therefore, one is able to predict that when etching in $CF_4$ alone, where the F° flux is much lower, the anisotropy should be considerably improved. FIGS. 11 and 12 show some experimental data which support this view. In FIG. 11 the frequency dependence of A is given for $CF_4$-$O_2$ (the solid lines) and for $CF_4$ alone (the data points). In all cases, A is significantly larger for the $CF_4$ etchant. FIG. 12 shows that for the same run conditions, the ratio $R_{Si}/R_{PR}$ for $CF_4$ is essentially unchanged from the value for $CF_4$-$O_2$ at 300 KHz and is somewhat lower at 8 KHz. $R_{PR}$ is noted to be acceptably low on the ground electrode but somewhat higher on the RF electrode, which again may be the cause of the lower anisotropy noted in the samples etched on that electrode.

The above experiments establish the anisotropic etching of semiconductor workpieces with minimal photoresist attack on a cooled ground potential electrode and with a measurable photoresist attack on an uncooled RF electrode. Importantly, the results were obtained with a $CF_4$-$O_2$ etch gas, which heretofore has only yielded isotropic etch profiles. Similar results are noted with CF$_4$ or CClF$_3$ as the etch gas.

The magnitude of the etch rate noted gives some indication of the relative importance of charged and neutral species. If we assume that material removal is by sputter etching, where the ionic species sputter as effectively as Ar+, then the calculated sputtering rate is an order of magnitude less than the observed etch rate. If, on the other hand, we compare the upper limit of ion flux on the wafer, as calculated from the measured power and voltage delivered during etching, with the removal rate of Si atoms, as found from the etch rate, it is seen that a lower limit of one Si atom is removed per incident ionic species. A model has been proposed in which reactive species such as F° are formed on the substrate surface by ion induced disassociation of a neutral molecule which had been previously absorbed from the gas phase. The reactive species would immediately form an Si-F bond without migrating. This proposed model would account for the etch rate observed in the instant invention. Another and different model has been proposed in which the bombardment by ionic species damages the surface, making it more likely for a reactive neutral species produced in the plasma to form an Si-F bond in the damaged region rather than on undamaged material. Since it is possible for the production rate of damage sites to equal the arrival rate of ionic species, this model can equally well account for the observed etch rate. Interestingly, both models also predict anisotropic etch profiles, as actually observed. Of course, conventional sputter etching as with Ar+ ions can be ruled out, because the etch rate of that process would be almost ten times lower than observed. However, with the present data, it is not possible to distinguish between possible "ion-assisted" models.

The experimental data shown in FIGS. 8, 9, 11 and 12 clearly shows that the anisotropy increases as the frequency decreases. It has not yet been established whether this is a consequence of increased ion flux or increased ion energy at the low-frequencies. The pressure dependence shown by the graph in FIG. 10 is believed to depict the effect of ion-neutral collisions in sheath 52 (FIG. 6). At high pressure, ions being accelerated toward the sample will undergo several collisions with neutral gas molecules. These collisions will decrease the energy of the ions and also make their momentum distribution more isotropic. As the ion neutral scattering length becomes larger than the sheath thickness, the ions should reach the wafer surface with energies on the order of ($\phi_p - \phi_w$) and with trajectories which follow the electric field lines. At a pressure of 50 millitorr, the molecular mean free path is about 1 mm, which is comparable to the sheath thickness expected for this plasma. Although this qualitative analysis gives some physical insight into why the graph of FIG. 10 has the shape that it does, the quantitative model which accurately describes the results presented herein, as well as predicting other results, is complex and is, therefore, not presented at this time.

Figure 13:
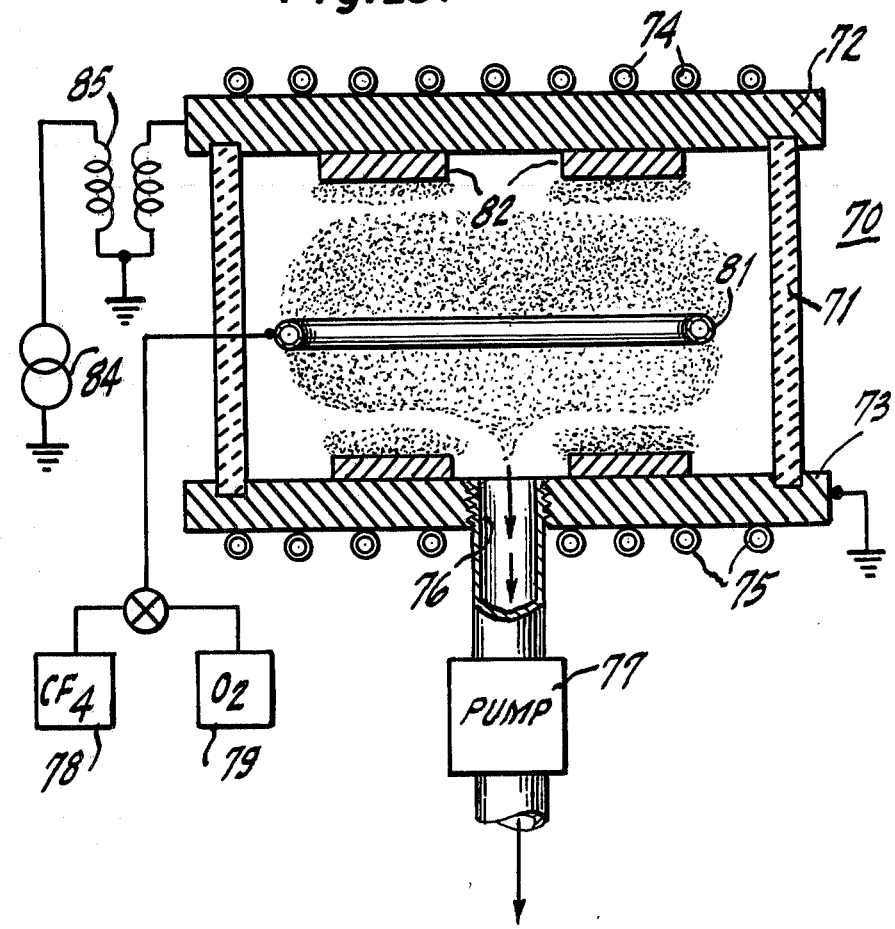
FIG. 13 is a cross-sectional view of an alternate embodiment of the reaction chamber shown in FIG. 6.

In summary, it has been discovered that a conventional plasma etching system, when operated at low-pressure and low-frequency, produces the surprising and unexpected result that anisotropic etch profiles are achieved in silicon and other materials, on both electrodes. Another surprising result is that photoresist attack, especially on the ground electrode, is minimal. It is readily predictable that the addition of cooling capacity to the RF electrode will correspondingly decrease photoresist attack and make results on that electrode comparable to those obtained on the ground electrode. When this is done the machine throughput will be large enough to be commercially attractive. FIG. 13 depicts one illustrative reaction system in which both the RF and ground electrodes are cooled. As shown, reactor 70 comprises a sealed reaction chamber defined by upper and lower cylindrical electrodes 72 and 73, respectively and a hollow cylindrical member 71 of a non-conductive material such as quartz. The upper electrode 72 is cooled by means of a plurality of pipes 74 through which a coolant such as water is flowed. In like fashion, the lower electrode 73 is cooled by a plurality of cooling pipes 75. The lower electrode 73 includes an aperture 76 through which spent gases may be exhausted by means of a pump 77. Etchant gas, for example a mixture of CF$_4$ and O$_2$, is supplied from reservoirs 78 and 79 to a circular supply pipe 81 which is positioned midway between the upper and lower electrodes. Workpieces 82 to be etched are supported both on the upper electrode 72 and the lower electrode 73. As was the case with the embodiment previously described with reference to FIG. 6, an alternating electric field is established between electrodes 72 and 73 by AC source 84 which is connected to the primary of a transformer 85, the secondary of which is connected directly to electrode 74. Electrode 73 is connected directly to ground and electrode 72 is grounded through the secondary winding of transformer 85. Again, this arrangement insures that no DC potential can build up on either two electrodes; however, this arrangement in no way interferes with the application of the AC potential across the two electrodes. Advantageously, the excitation frequency is greater than 0 Hz but less than 300 KHz, with 1000 Hz to 300 KHz being the preferred range.

From the data presented in FIGS. 8, 9, 11 and 12, the areal power density of the system in W/cm$^2$ is seen to be at least 10 times lower than that found in reactive ion systems yet, surprisingly, the etch rates are comparable. It should also be noted that the volume power density, typically 0.01 W/cm$^3$ or less, is also significantly lower than that heretofore obtained. Although detailed MOS radiation damage studies have not been made, it is expected that the results will be at least as good as those obtained with conventional systems because the interelectrode voltage is comparable and, because of the lower power density, the electron flux is much less.

So far we have assumed that the workpieces being etched are solid; however, in general, the workpiecess will be multilayered workpieces with at least the upper layer comprising silicon, polysilicon, SiO$_2$, Si$_3$N$_4$, etc. Also, anisotropic etching of metals such as Al and combinations such as a layer of Al or tantalum on Si are also contemplated by this invention. Any suitable etchant gas may be used, although CF$_4$, CClF$_3$ and a mixture of CF$_4$ and O$_2$, preferably in the range 85–95% CF$_4$ and 5–15% O$_2$, are preferred.

One skilled in the art may make various changes and substitutions without departing from the spirit and scope of the invention.

What is claimed is:

1. A method of anisotropically etching a workpiece, said workpiece being positioned within an evacuated reaction chamber, the method comprising the steps of:
   creating a partial vacuum in said reaction chamber such that the pressure in said chamber is less than one torr;

flowing a stream comprising at least one etchant gas through said chamber;

exciting said stream, by the application of an alternating electric field thereto, to form a gaseous plasma having a volume power density less than 0.01 $W/cm^3$, said alternating electric field having a frequency which is greater than 0 Hz but less than 100 KHz; and exposing said workpiece to said plasma for a predetermined time interval to etch said workpiece.

2. The method according to claim 1 wherein said alternating electric field has a frequency which is greater than 1000 Hz but less than 100 KHz.

3. The method according to claim 1 including the further step of:

continuously cooling said workpiece during said etching process.

4. The method according to claim 1 wherein said etchant gas comprises a mixture of $CF_4$ and $O_2$.

5. The method according to claim 4 wherein said mixture of $CF_4$ and $O_2$ is in the ratio of 85-95% $CF_4$ and 5-15% $O_2$.

6. The method according to claim 1 wherein said etchant gas comprises $CF_4$.

7. The method according to claim 1 wherein said etchant gas comprises $CClF_3$.

8. The method according to claim 1 wherein said workpiece comprises a multilayer workpiece, at least the upper layer thereof being comprised of a semiconductor material selected from the group consisting of silicon, polysilicon, $SiO_2$, and $Si_3N_4$.

9. The method according to claim 1 wherein said workpiece comprises aluminum.

10. The method according to claim 1 wherein said workpiece is a multilayered workpiece comprising at least a layer of a metal and a layer of silicon.

11. The method according to claim 10 wherein said metal is selected from the group consisting of tantalum and aluminum.

12. The method according to claim 1 wherein the pressure in said chamber is less than 200 millitorr.

13. A method of anisotropically etching a workpiece, said workpiece being positioned within an evacuated reaction chamber, the method comprising the steps of:

creating a gaseous plasma in said reaction chamber by the excitation of at least one etchant gas, said plasma having a volume power density less than 0.01 $W/cm^3$ and said excitation being effected by the application of an alternating electric field to said etchant gas, said alternating field having a frequency which is greater than 0 Hz but less than 300 KHz; and then exposing said workpiece to said gaseous plasma for a predetermined time interval at a reaction chamber pressure of less than one torr.

14. The method according to claim 1 wherein said alternating electric field has a frequency which is greater than 1000 Hz but less than 300 KHz.

15. The method according to claim 13 wherein said workpiece is continuously cooled during the etching process.

16. The method according to claim 13 wherein said at least one etchant gas comprises $CF_4$.

17. The method according to claim 13 wherein said at least one etchant gas comprises a mixture of $CF_4$ and $O_2$.

18. The method according to claim 17 wherein said gases are in the ratio of from 85-95% $CF_4$ and from 5-15% $O_2$.

19. The method according to claim 13 wherein said at least one etchant gas comprises $CClF_3$.

20. The method according to claim 13 wherein said workpiece comprises a multilayer workpiece, at least the upper layer thereof being comprised of a semiconductor material selected from the group consisting of silicon, polysilicon, $SiO_2$, and $Si_3N_4$.

21. The method according to claim 13 wherein said workpiece comprises aluminum.

22. The method according to claim 13 wherein said workpiece is a multilayered workpiece comprising at least a layer of a metal and a layer of silicon.

23. The method according to claim 22 wherein said metal is selected from the group consisting of aluminum and tantalum.

24. The method according to claim 13 wherein the pressure in said chamber is less than 200 millitorr.

25. A method of anisotropically etching a workpiece, the method comprising the steps of:

creating a gaseous plasma in an evacuated reaction chamber by exciting at least one etchant gas by the application of an alternating electric field thereto; and then adjusting the pressure in said reaction chamber such that the mean free path of neutral gas molecules in the reactor is greater than the thickness of the sheath which is naturally formed between the plasma and the workpiece.

26. The method according to claim 25 wherein said at least one etchant gas comprises $CF_4$.

27. The method according to claim 25 wherein said at least one etchant gas comprises a mixture of $CF_4$ and $O_2$.

28. The method according to claim 25 wherein said at least one etchant gas comprises $CClF_3$.

29. The method according to claim 25 wherein said workpiece comprises a multilayer workpiece, at least the upper layer thereof being comprised of a semiconductor material selected from the group consisting of silicon, polysilicon, $SiO_2$, and $Si_3N_4$.

30. The method according to claim 25 wherein said workpiece comprises aluminum.

31. The method according to claim 25 wherein said workpiece is a multilayered workpiece comprising at least a layer of a metal and a layer of silicon.

32. The method according to claim 31 wherein said metal is selected from the group consisting of aluminum and tantalum.

* * * * *

UNITED STATES PATENT AND TRADEMARK OFFICE
CERTIFICATE OF CORRECTION

PATENT NO. : 4,253,907
DATED : March 3, 1981
INVENTOR(S) : P. D. PARRY and L. G. JERDE It is certified that error appears in the above—identified patent and that said Letters Patent is hereby corrected as shown below:

On the title page, under the section entitled "OTHER PUBLICATIONS", "Isotropic and Anisotropic Etching in Adiode System" should read --Isotropic and Anisotropic Etching in A Diode System--.

In the specification, Column 4, line 4, "essestial" should read --essential--. Column 5, line 32, "F°" should read --F*--; line 37, "F°" should read --F*--. Column 9, line 52, "are collected" should read --was collected--; line 63, "+100Å" should read -- ±100Å--. Column 10, line 46, "F°" should read --F*--; line 50, "F°" should read --F*--. Column 11, line 15, "F°" should read --F*--. Column 12, line 38, "areal" should read --real--; line 50, "workpiecess" should read --workpieces--.

In the claims, Column 13, claim 14, line 58, "claim 1" should read --claim 13--.

Signed and Sealed this

Ninth Day of June 1981

[SEAL]

Attest:

RENE D. TEGTMEYER

Attesting Officer     Acting Commissioner of Patents and Trademarks